(12) United States Patent
Sogard

(10) Patent No.: US 6,897,940 B2
(45) Date of Patent: May 24, 2005

(54) SYSTEM FOR CORRECTING ABERRATIONS AND DISTORTIONS IN EUV LITHOGRAPHY

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/455,254

(22) Filed: Jun. 4, 2003

(65) Prior Publication Data

US 2004/0013956 A1 Jan. 22, 2004

Related U.S. Application Data

(60) Provisional application No. 60/391,059, filed on Jun. 21, 2002, and provisional application No. 60/390,880, filed on Jun. 21, 2002.

(51) Int. Cl.[7] .................. G03B 27/52; G03B 27/62; G03B 27/32; G03B 27/34
(52) U.S. Cl. .................. 355/55; 355/75; 355/77; 355/57
(58) Field of Search .................. 355/55, 52, 53, 355/72, 75, 77, 73, 74, 57; 250/492.1; 359/845

(56) References Cited

U.S. PATENT DOCUMENTS

| | | | |
|---|---|---|---|
| 4,003,640 A | 1/1977 | Hansen | |
| 4,679,915 A | 7/1987 | Kriz et al. | |
| 4,737,621 A | 4/1988 | Gonsiorowski et al. | |
| 4,875,765 A | 10/1989 | Vandenberg et al. | |

(Continued)

FOREIGN PATENT DOCUMENTS

| | | |
|---|---|---|
| EP | 0961149 A2 | 1/1999 |
| EP | 1231513 A1 | 8/2002 |
| GB | 2128733 A | 5/1984 |
| WO | WO02/056114 A2 | 7/2002 |

OTHER PUBLICATIONS

Hardy, John W., *Active Optics: A New Technology for the Control of Light,* IEEE, vol. 66, No. 6, Jun. 1978.
Ealey, Mark A., *Active and Adaptive Optical Components: The Technology and Future Trends,* SPIE, vol. 1543 Active and Adaptive Optical Components, 1991.

(Continued)

*Primary Examiner*—Peter B. Kim
(74) *Attorney, Agent, or Firm*—Beyer Weaver & Thomas LLP

(57) ABSTRACT

A system for correcting aberration and distortion in EUV lithography places a reticle on a deformable reticle chuck, and a reticle height sensor is used to measure the surface height of the reticle placed on the deformable reticle chuck. An optical system projects EUV radiation onto the reticle and collects and projects reflected EUV radiation from the reticle through its exit pupil onto a wafer placed on a wafer chuck. A deformable mirror disposed proximal to the exit pupil may also be controlled for this purpose. The deformable reticle chuck and the deformable mirror are controlled such that aberration and distortion of an image of the reticle formed on the wafer by the optical system are corrected based on the height measured by the reticle height sensor. The deformable reticle chuck includes a supporting structure, a deformable membrane disposed above and being comprised of a dielectric layer and a conductive layer, a voltage source connected to the conductive coating on the reticle and the conductive layer to generate an electrostatic attractive force between them, a plurality of actuator rods each connected to a corresponding one of actuators, and a coolant gas inside a chamber formed between the membrane and the top surface of the supporting structure. A deformable wafer chuck and wafer height sensor may be included to provide further correction of the image.

17 Claims, 11 Drawing Sheets

U.S. PATENT DOCUMENTS

| | | | |
|---|---|---|---|
| 5,005,961 A | | 4/1991 | O'Brien |
| 5,008,702 A | * | 4/1991 | Tanaka et al. ............... 355/52 |
| 5,026,977 A | | 6/1991 | Hubbard, Jr. |
| 5,142,132 A | | 8/1992 | MacDonald et al. |
| 5,229,889 A | | 7/1993 | Kittell |
| 5,745,309 A | | 4/1998 | Salmon |
| 5,793,473 A | * | 8/1998 | Koyama et al. ............. 355/55 |
| 6,053,409 A | | 4/2000 | Brobst et al. |
| 6,166,865 A | | 12/2000 | Matsuyama |
| 6,229,871 B1 | | 5/2001 | Tichenor |
| 2001/0026358 A1 | | 10/2001 | Van Dijsseldonk |
| 2002/0011573 A1 | | 1/2002 | Van Dijsseldonk |
| 2002/0012109 A1 | * | 1/2002 | Suzuki et al. ............... 355/53 |
| 2002/0017616 A1 | * | 2/2002 | Ota ......................... 250/492.1 |

OTHER PUBLICATIONS

Ealey, Mark A., *Actuators: Design Fundamentals, Key Performance Specifications, and Parametric Trades,* SPIE, vol. 1543 *Active and Adaptive Optical Components,* 1991.

Tichenor, D.A., et al., *EUV Engineering Test Stand, U.S. Department of Energy, Lawrence Livermore National Laboratory,* preprint UCRL–JC–137668, Feb. 14, 2000.

Ealey, Mark A., et al., *Deformable Mirrors: Design Fundamentals, Key Performance Specifications, and Parametric Trades,* SPIE, vol. 1543 *Active and Adaptive Optical Components,* 1991.

Mosier, Gary, et al., *Integrated Systems Modeling,* Next Generation Space Telescope Presentation, Jan. 14, 1998.

Mosier, Gary, et al., *Integrated Systems Modeling,* Next Generation Space Telescope Presentation 197–1, Jan. 14, 1998.

Coulter, Daniel R., *Technology Program Overview,* Next Generation Space Telescope, Presentation to the NGST Standing Review Board, Jan. 14, 1998.

Bely, Pierre, *NGST Architectures,* Space Telescope Science Institute Presentation, Dec. 24, 1997.

Patent Abstracts of Japan, publication no. 2000–326170, *Elastically Deformable Electrostatic Chuck And Its Manufacture,* Tomaru Kazuhiko, et al., filed May 20, 1999.

Patent Abstracts of Japan, publication no. 62–038839, *Sucked Air Quality Controller,* Iyoda Hisao, filed Aug. 12, 1985.

Tyson, Robert K, *Principles of Adaptive Optics*; Academic Press, Inc.

* cited by examiner

SYSTEM FOR CORRECTING ABERRATIONS AND DISTORTIONS IN EUV LITHOGRAPHY

This applications claims benefit to U.S. Provisional application Ser. No. 60/391,059 filed Jun. 21, 2002, and claims benefit to U.S. Provisional application Ser. No. 60/390,880 filed Jun. 21, 2002.

BACKGROUND OF THE INVENTION

This invention is in the technical field of extreme ultraviolet (EUV) lithography.

A number of factors can degrade optical performance of EUV lithography tools. Manufacturing errors in the projection optics mirrors, as well as thermally induced deformations in their illuminated regions during operation, can produce optical aberrations which will degrade image quality at the wafer. Image placement errors (distortion) can also occur. Since the reticle illumination is non-telecentric, changes in reticle height (caused for example by non-flatness of the reticle) can also produce distortion at the wafer.

It is therefore an object of this invention to provide a system for correcting aberration and distortion in EUV lithography, or a lithographic projection apparatus.

In EUV lithography, the reticle is reflective and is chucked in the lithography tool by its unpatterned surface, not around its periphery as required for a reticle of a transmissive type. Because the reticle is reflective, it is illuminated away from normal incidence. Consequently, any variation in height of the reticle-patterned surface will lead to displacement of features, or distortion, at the wafer. If either the back side of the reticle or the mating chuck surface is not flat, or if particles are trapped therebetween during chucking, furthermore, the front surface of the reticle will become distorted, leading to further feature displacement at the wafer.

The reticle-patterned surface is composed of a multi-layer film coating, and the reflectivity of the coating is unlikely to be much greater than 0.65. Thus, the reticle will absorb a significant amount of EUV power, and therefore must be actively cooled. Also, because the coating has a tensile stress, the reticle may be slightly bowed and must be flattened by the chuck. Finally, high throughput EUV lithography tools are calling for reticle stage accelerations of up to 8 g (g being the gravitational acceleration). The reticle must therefore be held very firmly to avoid slippage and possible deformation caused by the acceleration.

It is another object of this invention to provide a reticle chuck suitable for correcting aberration and distortion in EUV lithography, or a lithographic projection apparatus.

SUMMARY OF THE INVENTION

For correcting aberration and distortion in EUV lithography, a system according to this invention places a reticle on a deformable reticle chuck, and a reticle height sensor is used to measure the surface height of the reticle placed on the deformable reticle chuck. An illumination system projects EUV radiation onto the reticle placed on said reticle chuck and collects and projects reflected EUV radiation from the reticle through the optical system's projection optics onto a wafer placed on a wafer chuck. A deformable mirror is preferably disposed proximal to the exit pupil of the projection optics as the last of a plurality of reflectors of the optical system. The deformable reticle chuck and the deformable mirror are controlled such that aberration and distortion of an image of the reticle formed on the wafer by the optical system are corrected based on the height measured by the reticle height sensor.

The deformable reticle chuck according to this invention to be used in such a system may be characterized as comprising a supporting structure, a deformable membrane disposed above the supporting structure and being comprised of a dielectric layer of a dielectric material and a conductive layer of an electrically conductive material, a voltage source such as a battery connected to a conductive coating on the back side of the reticle and to the conductive layer to generate an electrostatic attractive force between them, a plurality of actuator rods each connected through a weak spring to a corresponding one of actuators. The actuator rods penetrate the supporting structure and protrude above the top surface of the supporting structure and support and attach to the membrane. A chamber formed between the membrane and the top surface of the supporting structure contains a heat-conducting gas such as helium.

The supporting structure has throughholes through which a coolant fluid is passed, and the deformable reticle chuck may further comprise a clamping plate for clamping the actuator rods in place after they are adjusted.

The system may further comprise a wafer height sensor that detects the height of the wafer such that aberration and distortion of the image are corrected based also on the height measured by the wafer height sensor.

The wafer chuck may be made deformable such that distortion of the image is corrected also by deforming the wafer chuck.

BRIEF DESCRIPTION OF THE DRAWING

The invention, together with further objects and advantages thereof, may best be understood with reference to the following description taken in conjunction with the accompanying drawings in which.

DETAILED DESCRIPTION OF THE INVENTION

Figure 4:
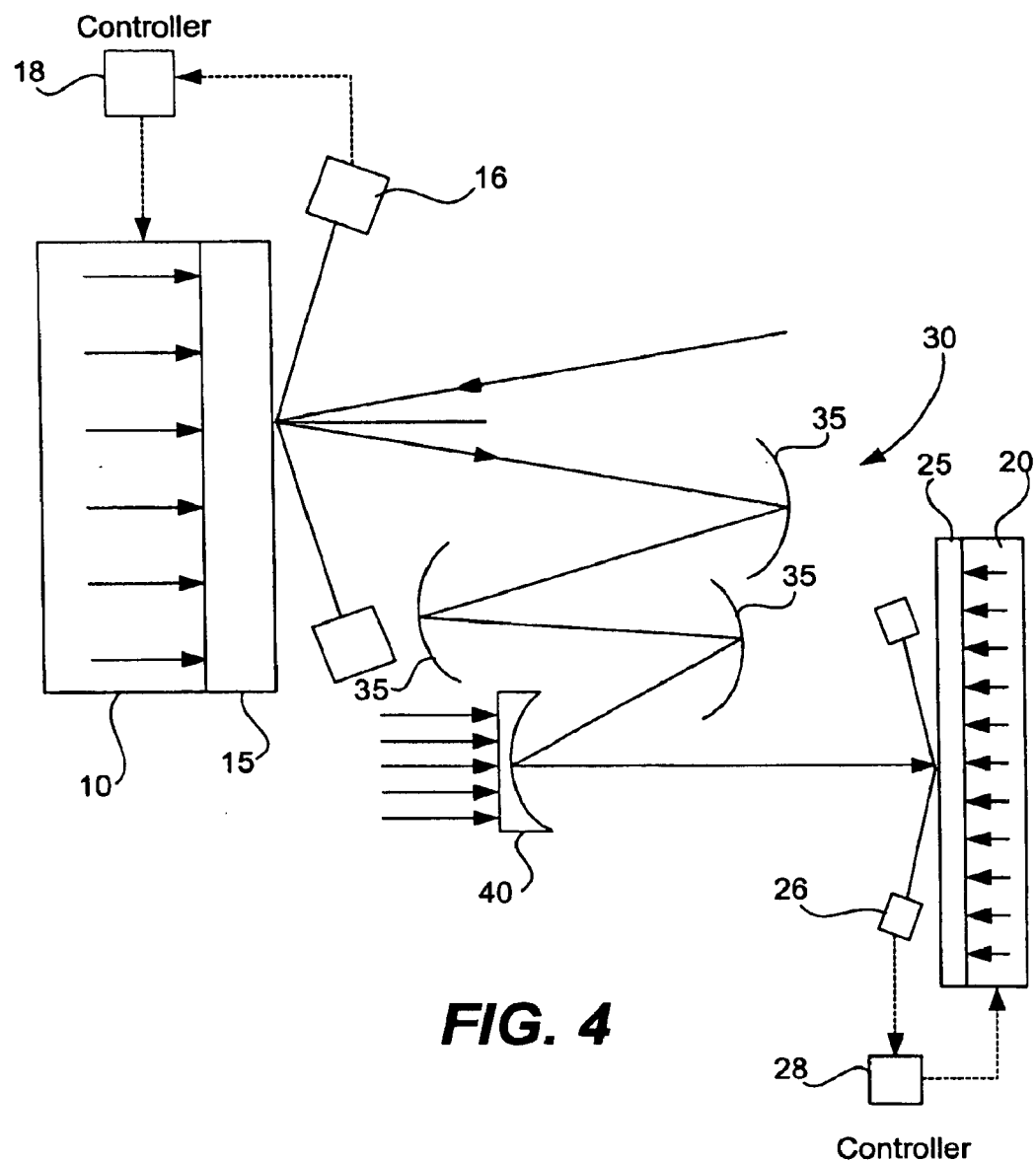
FIG. 4 is a schematic drawing of a portion of an EUV lithographic projection apparatus incorporating an aberration and distortion correcting system of this invention.

FIG. 4 shows schematically an EUV lithographic projection apparatus incorporating an aberration and distortion correcting system of this invention. EUV radiation from a source (not shown) is made incident on a reticle 15 set on a deformable reticle chuck 10, and reflected radiation from the reticle 15 is focused on a wafer 25 set on a deformable wafer chuck 20 by means of an optical system 30 including a plurality of intermediate reflectors 35 and a deformable mirror 40 serving as the last-stage reflector located proximally to the exit pupil (not shown) of the optical system 30. Numerals 16 and 26 respectively indicate a reticle height sensor and a wafer height sensor. Controller 18 processes the information from reticle height sensor 16 and adjusts the deformable reticle chuck 10. Controller 28 plays a similar role for the wafer height sensor 26 and deformable wafer chuck 20.

The theory of aberrations in a diffraction-limited system is described e.g. in Born and Wolf, Principles of Optics, Chap. 9. The best place to characterize and correct aberrations is in the exit pupil of the optics, where, in the absence of aberrations, a spherical wave converges to its center in the gaussian image plane. In a reflective optics projection system, the last mirror before the wafer should be quite close to the exit pupil, so it is the most suitable mirror to try to correct. In general, another location in the optics which is conjugate to the exit pupil could also be used. Because the reflectivity of the EUV mirror coatings is so low, however, the number of reflective surfaces must be kept to a minimum, so more than one choice for the correcting mirror is unlikely.

For a given aberration the aberrated wave front has a characteristic shape over the exit pupil. For a circular pupil, the most common, the wave fronts of the various aberrations can be characterized by Zernike polynomials which depend only on the radius r from the center of the pupil and the azimuthal angle θ. Wavefront shapes which cause distortion have a linear dependence on r, but many other aberrations also include a linear dependence on r, and hence any errors in measuring or adjusting the mirror surface to cancel other aberrations may inadvertently create distortion.

If the mirror surface is locally displaced by a distance z along the optical axis, and the local angle of incidence at the mirror at that point is α, then the change in optical path is given by $2z/\cos\alpha$ (since EUV lithography is done in vacuum, the index of refraction is 1.0). This corresponds to the local shift in the aberrated wave front, so for angles of incidence not too big, the aberrated wave front changes by twice the local displacement of the mirror surface. Since the aberrated wave front is not expected to differ from that of a spherical wave by more than approximately 1 nm, it follows that control of the mirror must be very precise, since the mirror surface must be controlled to better than 0.5 nm.

In this situation undesired distortion may be created by the correcting mirror because of measurement and control errors. It is possible to correct for this added distortion, as well as distortion from other sources, by appropriately adjusting the surface of the reticle. This can be done with the deformable reticle chuck 10, as will be described more in detail below. Distortion at the wafer 25 is easier to control from the reticle 15 than at the exit pupil, because much larger displacements of the reticle 15 are required for a given amount of distortion. In the example given later in connection with FIG. 8A, a distortion (image displacement) at the wafer 25 of 1 nm corresponds to a height change of about 40 nm at the reticle 15. Wafer distortion can be determined by sensors or test exposures. The reticle height sensor 16 is used to calibrate the reticle surface, and the reticle chuck 10 is then adjusted appropriately.

If the EUV lithography tool is a stepper, the appropriate reticle shape can be determined and set, and no further changes are needed. For a step and scan system, however, the wafer and reticle are mechanically scanned synchronously such that an arc shaped stripe of illumination moves across the reticle and wafer. This stripe represents the entire field of the projection optics. At the wafer it is typically a few mm wide in the direction of the scan and the width of the chip in length, say, of 25–33 mm. At the reticle (for system de-magnification M=4) the stripe dimensions might be about 5–10 mm by over 100 mm. Along the scan direction, therefore, the reticle would have to be deformed within a region of less than 10 mm in length. Given the thickness of the reticle 6.35 mm and the density of actuators needed to deform the reticle within a space of about 10 mm, this may be quite difficult to achieve. Also, the deformation must be applied dynamically to the reticle as it scans through the projection optics field; i.e. any deformation in the reticle must "follow" the illumination stripe across the reticle surface. Thus, correction of distortion originating in the projection optics along the scan direction may be very limited in practice.

Along the direction orthogonal to the scan however, there is more room for deformations to be applied. Also, the deformations will depend only on the distance from the center of the stripe, measured transversely to the scan direction. Therefore these deformations are static; they don't have to change as the reticle is scanned. Thus correcting for distortion in this direction is much easier.

Figure 5:
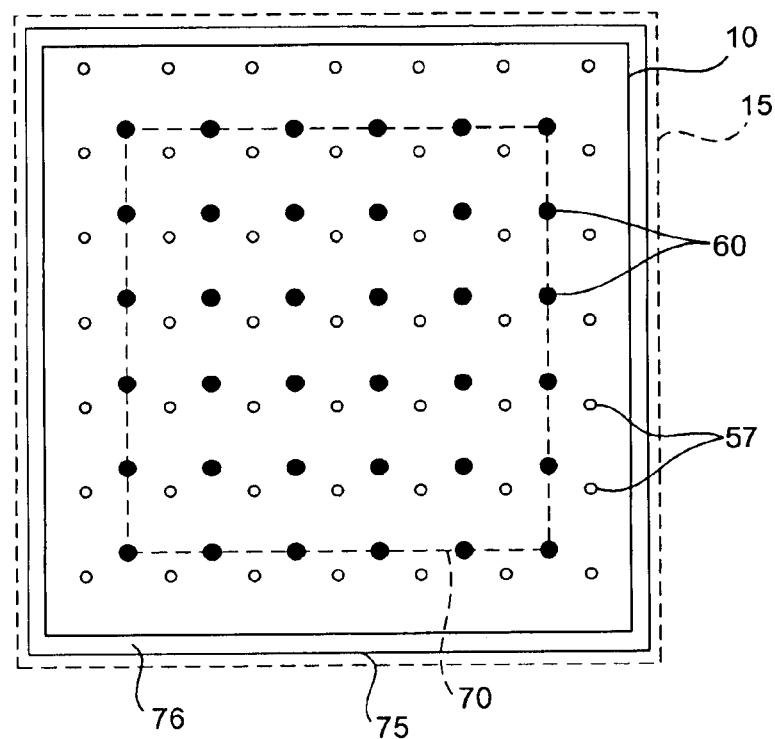
FIG. 5 is a plan view of a deformable reticle chuck embodying this invention.
Figure 6:
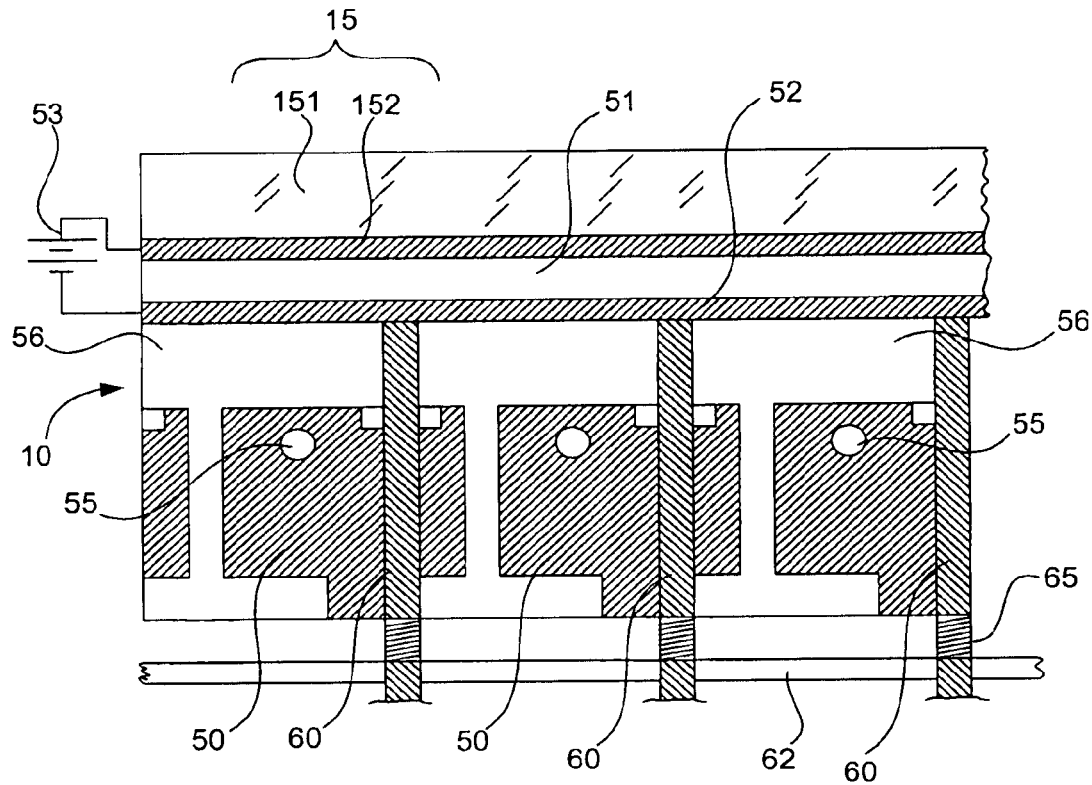
FIG. 6 is a schematic sectional view of the deformable reticle chuck of FIG. 5.

FIGS. 5 and 6 are referenced next to explain the structure of the deformable reticle chuck 10 according to an embodiment of this invention. In the following, the chuck and reticle are described in the conventional orientation, with the reticle sitting on top of the chuck. However, in an EUV lithography tool, the chuck may be upside down with the reticle attached beneath it.

The deformable reticle chuck 10 according to this embodiment is an electrostatic chuck. The surface of the unpatterned side of the reticle 15 is coated with an electrically conductive material such as a metallic film. In FIG. 6, the main body portion of the reticle 15 made of a glass or ceramic material is indicated by numeral 151 and its coating of the conductive material is indicated by numeral 152.

At the top of the chuck 10 above its supporting structure 50 is a double-layered thin membrane comprised of a dielectric layer 51 and an electrically conductive layer 52 below the dielectric layer 51. As the reticle 15 is placed on top of the chuck 10, a power supply or battery 53 serving as a voltage source connected to both the conductive coating 152 on the reticle 15 and to the conductive layer 52 at the top of the chuck 10 supplies an attractive electrostatic force therebetween across the dielectric layer 51, the latter serving to prevent the two conductive layers 52 and 152 from shorting.

The thin membrane of the dielectric and conductive layers 51 and 52 is attached to actuator rods 60 attached to actuators (not shown) distributed through the surface area of the chuck 10 and each adapted to move up and down, penetrating the supporting structure 50 by the actuating force of a corresponding one of the actuators. The actuator rods 60 are restricted to the region 70 of the reticle 15 which is imaged to the wafer. A cooling gas such as helium at sub-atmospheric pressure is contained in a thin chamber 56 beneath the membrane and transports heat by conduction from the reticle 15 through the membrane to the supporting structure 50 which is provided with throughholes 55 for a coolant to flow through. The membrane is secured to the supporting structure 50 along a rim 76 at its periphery 75, providing a hermetic seal.

Two basic types of actuators can be employed. Displacement actuators control the shape of the reticle by adjusting their length between the reticle and a fixed base plate. However, any distortion of the base plate will change the reticle figure unless the displacement of the actuator caused by the distortion of the base plate is corrected. In contrast, a force actuator applies a specified force to the reticle to achieve the desired deformation. Thus, as long as the force is constant, the reticle figure is fixed, even if the base plate should deform. Unfortunately, displacement actuators may be difficult to adjust to obtain very small length changes and are not generally well-suited to the types of adjustment required for lithographic applications, particularly in terms of stability. However, by inserting a relatively weak spring between the fixed end of an actuator (e.g. a displacement actuator) and the back of the reticle chuck membrane, small changes in the actuator displacement have little effect on the reticle figure, since their small displacements hardly affect the spring force. In other words, reticle deformation may be accomplished with force actuators or displacement actuators with much improved stability and control characteristics by the addition of a weak spring in the mechanical linkage such that they function in the manner of a stable and easily controllable force actuator. In the present embodiment, weak springs 65 are inserted between the actuators and the actuator rods 60.

The meaning of a "weak" spring is explained here. Since the displacements sought for the reticle are very small, linear behavior can be assumed. Then, in order to displace the reticle locally by an amount $\delta z_m$, a force $\delta F$ is required. The two are related by the force constant $K_m$ of the reticle which depends on the elastic properties of the reticle and is defined by the relation $\delta z_m = (dz/dF)_m \delta F = K_m \delta F$. The force $\delta F$ is produced by a compression of the spring with the displacement or force actuator. Assuming the spring to be elastic, the amount of compression required is given by $\delta F = k_s \Delta z_s$, where $k_s$ is the spring constant. Substituting for $\delta F$ gives the relation $\delta z_m = (dz/dF)_m \delta F = K_m \delta F = K_m k_s \Delta z_s$. The quantity $\delta z_m$ is typically of the order of a nanometer or less, and it is not easy to control displacements that small. But by adjusting the spring constant $k_s$ so that $\Delta z_s$ is much larger than a nanometer, control of the reticle displacement is simplified, and many different actuator types may be used. This condition is ensured by making $k_s$ sufficiently small relative to $K_m$. This is the meaning of a weak spring.

As is known, the thermal conductivity k of a gas is essentially independent of pressure as long as the mean free path of the gas molecules is small compared to the system dimensions. This is discussed in more detail below. This fact allows using a gas at a relatively low pressure in the chuck with little effect on the heat transfer. The relatively low pressure avoids distorting the membrane of the chuck. A large deformation would reduce the area of contact between the distorted membrane and the flat reticle, and it might weaken the membrane. It might also distort the reticle.

The membrane with the dielectric layer 51 and the conductive layer 52 contacts the reticle 15 at all points on its backside such that the attractive electrostatic force is maximal and slippage during acceleration will be minimized. Since this membrane is deformable, it can accommodate reticles with non-flat backsides or trapped particles without inducing unwanted deformation of the front surface.

The actuators (not shown) associated with the actuator rods 60 are controlled by the controller 18 using signals from the reticle height sensor 16, which monitors the reticle surface, so as to deform the backside of the reticle 15 appropriately such that the front surface of the reticle 15 will have a proper height and shape. Thus, image distortion at the wafer 25 due to non-telecentricity can be reduced. The actuators apply a specified force to the back of the reticle 15 through the actuator rods 60. Since the reticle is typically changed infrequently, the actuator rods 60 may be clamped in place (say, by means of a clamping plate shown at 62 in FIG. 6) after adjustment, and the actuator power can be turned off for stability and minimum heat generation. The clamp plate 62 is located below the springs 65, so the reticle remains positioned by means of force actuation, not displacement actuation.

Determining the proper reticle chuck actuator settings to reproduce a given shape of the reticle surface is similar to the task of adjusting the deformable mirror 40. This procedure is well known in the art of adaptive optics. A description of the principles can be found in the review paper by John Hardy, "Active Optics: a New Technology for the Control of Light", in Proceedings of the IEEE, Vol. 66, 651(1978), the contents of which are incorporated herein by reference. Further discussion of actuator controlled mirrors, as well as a discussion of mirror surface monitoring considerations for EUV applications, may be found in U.S. patent application (NRCA invention disclosures 485/504) by A. Phillips and M. Sogard.

Figure 7A:
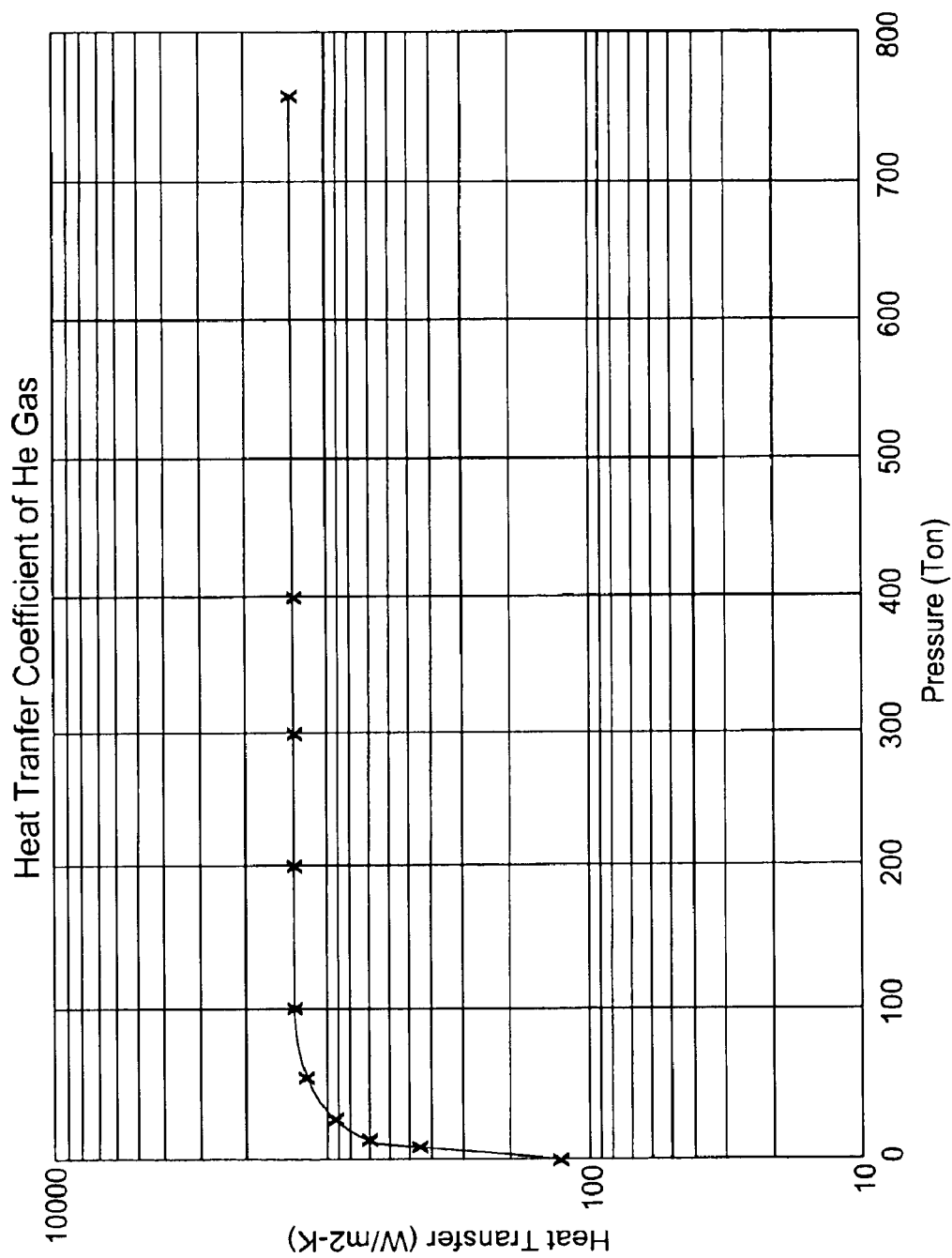
FIGS. 7A and 7B show the heat transfer coefficient of helium gas as a function of pressure and distance between reticle chuck membrane and base.
Figure 7B:
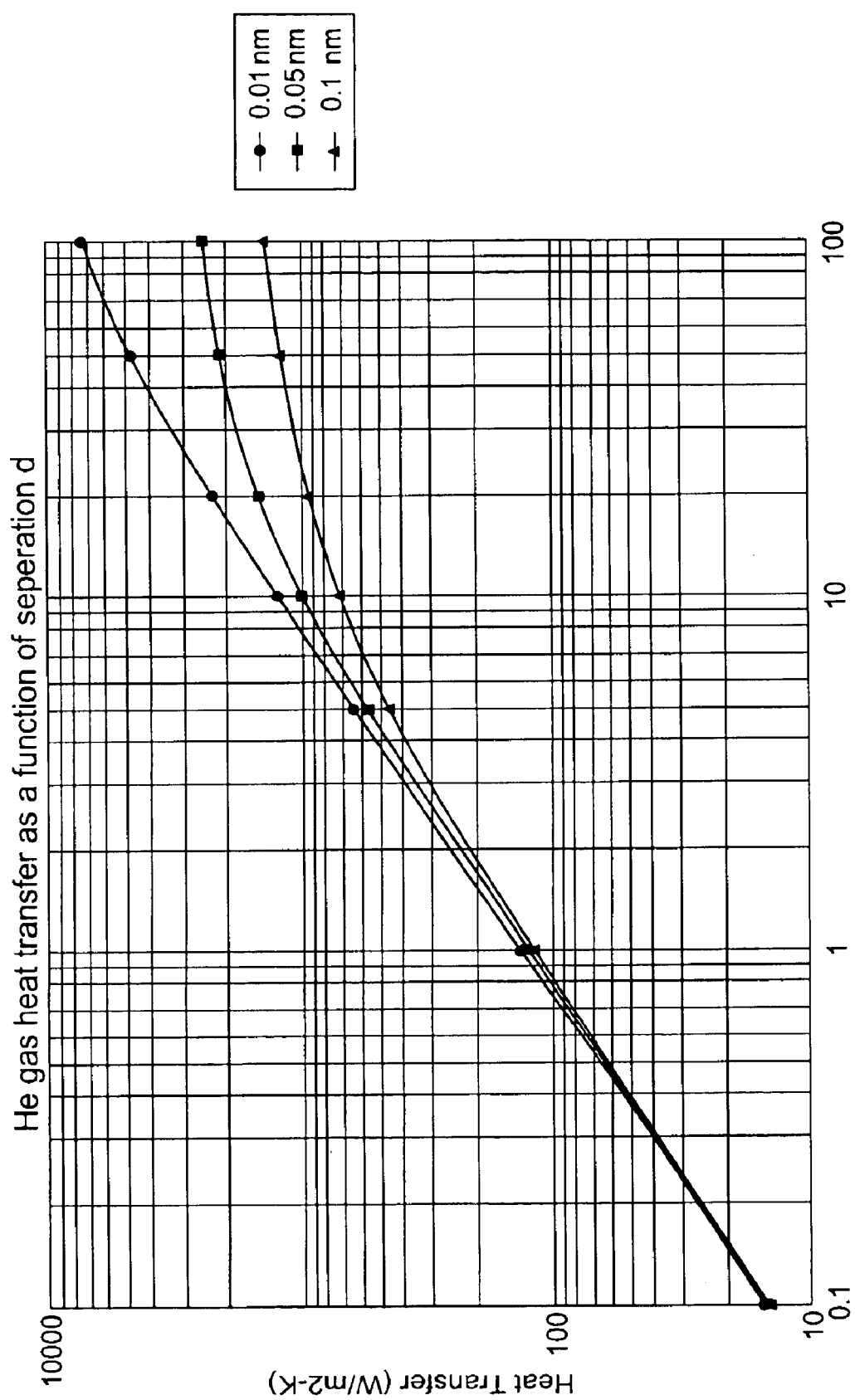

FIG. 7A shows the heat transfer coefficient of He gas as a function of pressure for two parallel surfaces separate by distance d=100 μm. FIG. 7A is based on expressions from the paper "Low temperature etch chuck: modeling and experimental results of heat transfer and wafer temperature," by D. Wright et al., published in Journal of Vacuum Science and Technology, A10, 1065 (1992). As can be seen, the heat transfer coefficient decreases by only about 15% as the pressure decreases from an atmospheric pressure of 760 Torr to about 50 Torr, which is about 6% of atmospheric pressure. At 50 Torr, the mean free path in He at a temperature of 25° C. is about 2.9 μm, which is a small fraction of the separation d. However, the heat transfer of the gas is a function of the dimensions of the chuck. If the distance between the membrane surface and the base of the chuck is d, FIG. 7B shows the heat transfer of He for several values of d. As can be seen, a small value of d enhances the heat transfer. For example, at a pressure of 100 Torr and a separation of d=100 μm, the heat transfer is about 1305 W/m²·°K, which is about 8% less than its value at atmospheric pressure. Thus efficient heat transfer is possible with this chuck at internal pressures small enough to cause no problems in the present vacuum application.

The deformable reticle chuck 10 thus structured is vacuum-compatible. The EUV reticle is in a vacuum environment.

The stroke required for the actuators is relatively small but a few of the actuators may be adapted for longer strokes for use when the reticle 15 is popped up off the chuck 10 to be removed. This may be useful because electrostatic chucks sometimes stick and some time may be required for the charge to bleed off.

Figure 8A:
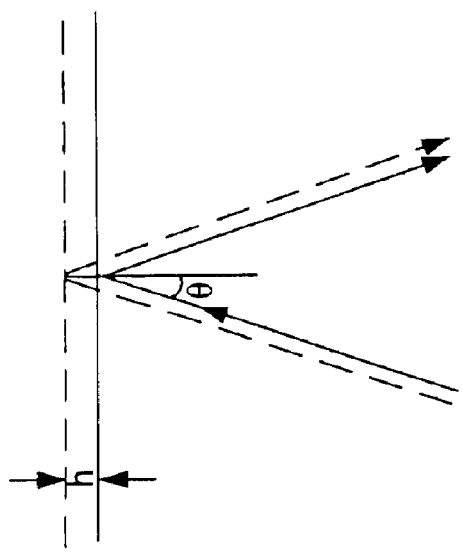
FIGS. 8A and 8B show how distortion is created by non-telecentricty and deformation of the reticle.

Correction of distortion by adjustment of the reticle surface using the deformable reticle chuck will be explained in more detail here. FIG. 8A illustrates the effect of non-telecentricity on distortion. If the reticle is displaced a distance h vertically from its nominal height, illumination which is not normally incident on the reticle causes radiation reflected from a feature on the reticle to be displaced by a distance h tan θ in the plane of incidence of the illumination. If the reticle image at the wafer is demagnified by a factor M, then a distortion of h tan θ/M is produced at the wafer. For example, if θ≈6° and M=4, the distortion at the wafer is approximately h/40.

Figure 8B:
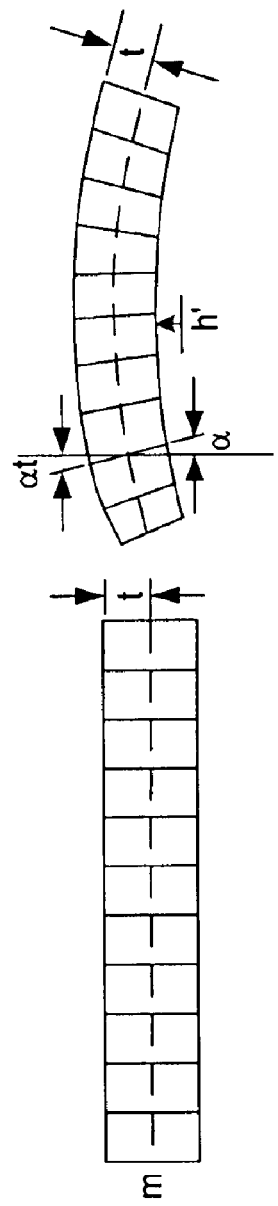

There are other sources of distortion as well, some of which can be corrected. When the reticle is patterned in the maskwriting tool, some tool related distortion may occur. This usually can't be corrected. Distortion also occurs if the reticle is mechanically deformed, as illustrated in FIG. 8B where an initially flat plate is bent into a curved shape. For relatively small deformations a plane m, called the midplane, exists whose length is unaffected by the deforming, and a straight line normal to the surface of the midplane remains normal to it and unchanged in length after deformation. Above and below the midplane, the plate is stretched or compressed by the applied deforming force. A series of uniformly spaced lines normal to the midplane is shown. After deformation of the plate, the spacing of the lines at the top surface is changed, the displacement, or distortion, equal to $\alpha t$, where $\alpha$ is the angle between the local normal to the midplane and the normal to the original undeformed midplane, and t is the distance from the midplane to the surface of the plate. For a plate of homogeneous properties the midplane is located in the middle of the plate.

After the reticle has been patterned in the maskwriter tool, the pattern is checked for errors and distortion in inspection and metrology tools. If distortion is too much, the reticle must be repaired or replaced. Distortion arising from mechanical deformation of the reticle should be distinguished from the intrinsic displacement errors created by the maskwriter tool however. If the reticle is chucked identically in both maskwriter and metrology tools, no distortion from mechanical deformation will occur, and if the reticle is chucked identically in the EUVL exposure tool, again no distortion from mechanical deformation will occur. In practice, some differences in chucking may occur, and these must be corrected for. This can be done by monitoring the flatness of the reticle when it is chucked. Differences in flatness can be related to distortion through the geometrical arguments above. The metrology tool measurements can then be compensated for the distortions added by the chucking differences, so that the distortions intrinsic to the maskwriter tool can be determined. Similarly any reticle flatness differences between the maskwriter tool and the EUVL tool will lead to additional distortions unless compensated for. This can be done with a EUVL reticle chuck whose flatness is adjustable, so that the reticle flatness can be corrected to that during the patterning in the maskwriter. This also requires a reticle flatness monitor in the EUVL tool.

Such corrections are needed because maskwriter chucks are not necessarily perfectly flat, reticle blanks themselves are not perfectly flat, and a chance exists that small particles may accidentally attach to reticle or chuck surfaces, thereby preventing perfect mating of the two surfaces, leading to deformation of the reticle surface. Ideally the reticle surface will be flat during the maskwriting, so the EUVL reticle chuck must re-establish that flatness in the EUVL tool. However, if the reticle was not flat during the maskwriting, and the non-flatness is preserved by the EUVL reticle chuck, the reticle height variations will lead to distortions at the wafer due to the illumination non-telecentricity, as described above. These distortions can be eliminated, if the reticle is flattened, but then distortions from the resulting deformation of the reticle are created. At present the only solution to this problem is to place very tight specifications on reticle and chuck flatness, so that residual height variations lie within a tolerable amount.

It is possible to reduce these distortions at the wafer. In particular, the component of the distortion lying in the plane of incidence of the illumination can be reduced and in some cases eliminated entirely. This is done essentially by using distortions arising from reticle deformation to cancel the distortions arising from height variations. When the reticle surface is deformed, in general both the reticle height h' changes and the slope changes, as illustrated in FIG. 8B. The angle $\alpha$ for small deformations is just equal to the local slope of the reticle surface. Strictly speaking $\alpha$ is the component of the slope in the plane of incidence of the illumination. The distortion at the wafer caused by the deformation and the illumination non-telecentricity has a contribution from the height change h' which is given by h' tan $\theta$/M, as well as the actual distortion at the reticle which contributes an amount $\alpha t$/M at the wafer. The total distortion at the wafer is then given by $$h \tan \theta / M + h' \tan \theta / M + \alpha t / M \quad (1)$$

If these three components can be adjusted so as to cancel out, the component of the distortion at the wafer in the plane of incidence of the illumination can be eliminated. This can be done as follows. Define a coordinate system with the X and Y axes lying in the plane of the reticle surface, and the Z axis extending out of the surface. Let the illumination plane of incidence coincide with the X-Z plane. Define the initial non-flatness of the surface by the function Zret(x, y), so that at a point (x, y) the distance between the surface and a plane lying at the average height of the surface is Zret(x, y)=h. Distort the surface of the reticle with the reticle chuck, so that at the point (x, y) the height changes by an amount Zchuck(x, y)=h'. The change in the local slope along the X-axis is then given by $\partial$Zchuck(x, y)/$\partial$x=$\alpha$. Substituting into Eq. 1 and requiring that the total distortion at the wafer is zero, we get the differential equation $$\partial Zchuck(x, y)/\partial x + Zchuck(x, y)\tan \theta/t = -Zret(x, y)\tan \theta/t. \quad (2)$$

This has the solution $$Zchuck(x, y) = \quad (3)$$
$$Zchuck(0, y) - \tan\theta/t \int_0^x \exp(-(x-x')\tan\theta/t)Zret(x', y)dx'.$$

Figure 8C:
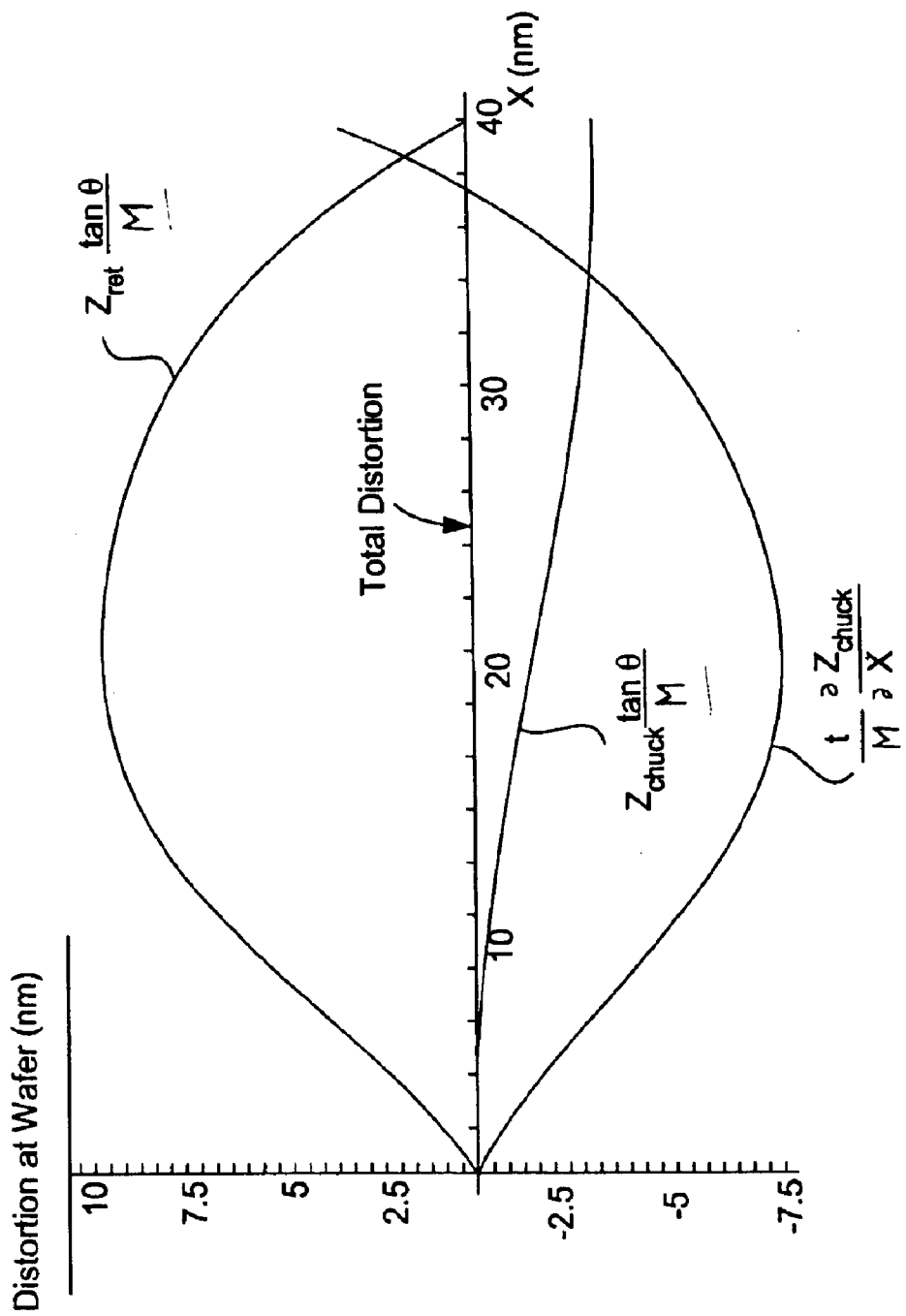
FIG. 8C illustrates the correction of distortion at the wafer by a combination of deformation and height change of the reticle.

Therefore, within a plane y=constant the distortion at the wafer can be made identically zero. Note incidentally that the projection optics demagnification M doesn't appear in this expression. FIG. 8C illustrates the correction of a height related distortion Zret by deforming the reticle surface by a function Zchuck using Eqs. 2 and 3.

Figure 9B:
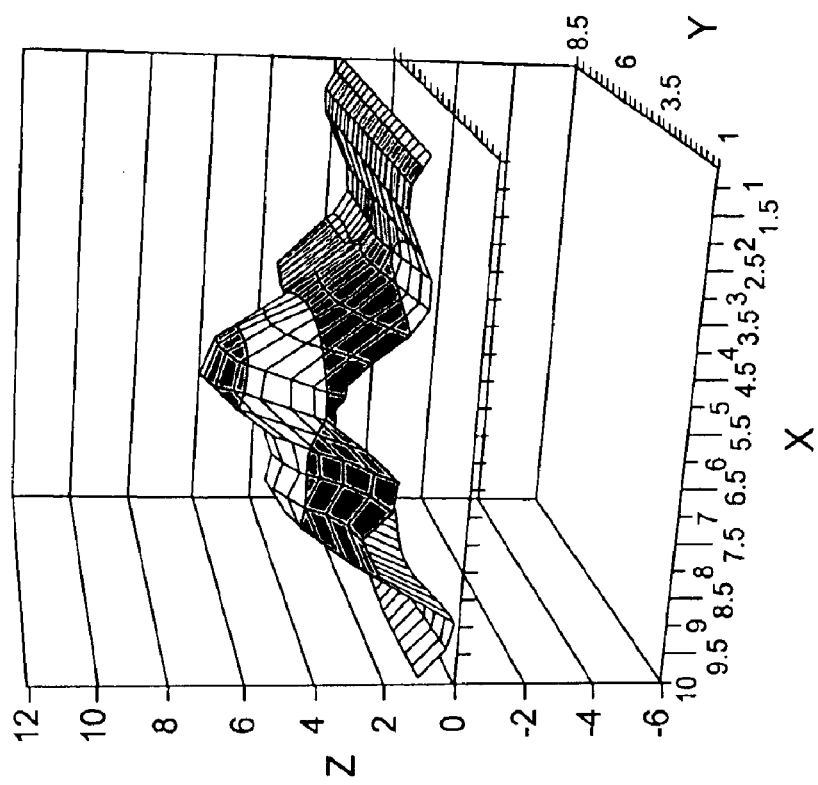
FIGS. 9A and 9B show different patterns of height variation at the reticle.
Figure 9A:
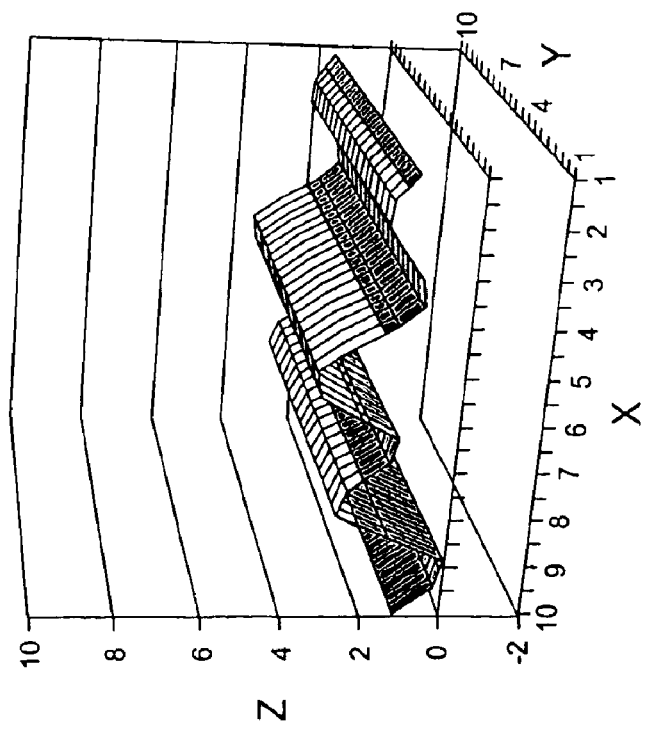

This technique eliminates the X-component of distortion within a plane y=constant. If the reticle height variations depend only on x, i.e. Zret(x, y)≡Zret(x), as illustrated in FIG. 9A, then the solution found in Eq. 3 can be used for all values of y, and the distortion at the wafer can be completely eliminated. More commonly, the reticle height variation will look more like FIG. 9B, and Zret will depend on both x and y. In this case it is not possible to completely eliminate the distortion at the wafer, but the X component of distortion can be minimized by suitably adjusting Zchuck(x, y) using various optimization techniques known in the art. For example an error function can be constructed which is related to the X component of the residual distortion at the wafer:

$$Dx \equiv \sum_i \sum_j \left[ (Zret(x_i, y_j) + Zchuck(x_i) + Zplane(x_i, y_j)) \frac{\tan\theta}{M} + \frac{t}{M} \frac{\partial Zchuck(x_i)}{\partial x} \right]^2, \quad (4A)$$

where the summations are over all points $(x_i, y_j)$ where Zret was measured. The function Zplane defines a flat plane whose position and orientation is optimized to help minimize Dx. It is explicitly separated from Zchuck, because in practice Zplane is likely to be set by adjusting the reticle stage orientation and height, rather than adjusting the reticle chuck shape, although the latter operation is also possible. By adjusting both Zplane and Zchuck to minimize Dx the X component of the residual distortion at the wafer can be minimized in the least squares sense. The total distortion at the wafer will in general include components in the X-direction (in the illumination plane of incidence) and the Y-direction. Since Zchuck(x) does not depend on y, no distortion of the reticle in the Y-direction will occur, so the Y-component of distortion at the wafer is not affected by this optimization.

Because of the non-telecentricty effect, the X components of the distortion at the wafer will probably be greater than the Y components initially. The total distortion at a point will be the vector sum of the X and Y components of distortion, dx and dy, leading to a magnitude of $[dx^2+dy^2]^{1/2}$. Therefore, it may happen that the smallest magnitudes of distortion may be achieved, if Zchuck also includes a Y dependence, Zchuck=Zchuck(x, y). The Y component of distortion at the wafer will inevitably increase in this case, but if the X component is reduced by a greater amount, the magnitude of the distortion will still be reduced. This requires defining a new error function which includes both X and Y components of distortion:

$$Dtot \equiv \sum_i \sum_j \left\{ \left[ (Zret(x_i, y_j) + Zchuck(x_i, y_j) + Zplane(x_i, y_j)) \frac{\tan\theta}{M} + \frac{t}{M} \frac{\partial Zchuck(x_i, y_j)}{\partial x} \right]^2 + \left[ \frac{t}{M} \frac{\partial Zchuck(x_i, y_j)}{\partial y} \right]^2 \right\}. \quad (5A)$$

Again, by adjusting both Zplane and Zchuck to minimize Dtot the magnitude of the residual distortion at the wafer can be minimized in the least squares sense.

The procedures described above for reducing the distortion at the wafer are static, in the sense that the adjustment only has to be done once. Once the reticle shape is adjusted, the reticle chuck actuators can be clamped in place and the actuator power turned off. However these procedures may be extended to include correction of some distortion introduced to the image at the wafer by the EUV projection optics. In that case, the reticle must be constantly adjusted by the actuators, as different parts of the reticle are scanned through the illumination and their patterns projected onto the wafer. The relevant error functions now become $$Dx \equiv \sum_i \sum_j \left[ D_{POx}(X_i, Y_j) - (Zret(x_i, y_j) + Zchuck(x_i) + Zplane(x_i, y_j)) \frac{\tan\theta}{M} + \frac{t}{M} \frac{\partial Zchuck(x_i)}{\partial x} \right]^2, \quad (4B)$$

where $D_{POx}(X_i, Y_j)$ is the X component of the distortion at the wafer introduced by the EUV projection optics, $X_i$ and $Y_j$ are measured relative to the center of the image field, $(x_i,$ $y_j)$ is the point on the reticle corresponding to the position $(X_i, Y_j)$ in the image field, and the summation in i and j is only over the points lying within the image field, or equivalently the illumination field at the reticle. Thus, for given values of $X_i$ and $Y_j$, $D_{POx}(X_i, Y_j)$ will be constant, but Zret($x_i$, $y_j$), Zchuck($x_i$, $y_j$), and Zplane($x_i$, $y_j$) will be changing, as different parts of the reticle are scanned through the illumination field. The optimization of Zchuck and Zplane must be constantly updated during the scanning.

The expression corresponding to Eq. 5A is $$Dtot \equiv \sum_i \sum_j \left\{ \left[ D_{POx}(X_i, Y_j) - (Zret(x_i, y_j) + Zchuck(x_i, y_j) + Zplane(x_i, y_j)) \frac{\tan\theta}{M} + \frac{t}{M} \frac{\partial Zchuck(x_i, y_j)}{\partial x} \right]^2 + \left[ D_{POy}(X_i, Y_j) - \frac{t}{M} \frac{\partial Zchuck(x_i, y_j)}{\partial y} \right]^2 \right\} \quad (5B)$$

In the above expressions, the distance t to the midplane may not be that of the reticle, because the chuck will impose some constraint on lateral motion of the mating reticle surface as the reticle is being deformed. If the reticle is held in intimate contact with the chuck, so that no relative lateral motion is possible, and if the chuck and reticle have the same material properties (as would be desirable from themal expansion considerations), t will be equal to half their combined thickness. If the reticle and chuck have different material properties, or if some lateral relative motion between them is possible, t will have to be determined in a more complicated manner, either empirically or by more sophisticated modeling.

In this description it was assumed that the reticle was scanned in the X direction, i.e. parallel to the illumination plane of incidence. If the scan direction were orthogonal to the illumination plane of incidence, the previous arguments would have to be altered appropriately.

The idea of a deformable chuck may be applicable to the wafer 25 as well. Although the wafer is illuminated telecentrically and hence height variations do not lead to distortion, height variations will lead to defocus errors and may affect the balancing of aberrations. Also, if projection optics are not completely corrected for field curvature, even a flat wafer at the proper height will suffer some defocus error over the image field. Since field curvature increases away from the center of the field, it is likely to be more relevant in the direction normal to the scan, since the field dimension is greater in that direction. Following the argument for the reticle above, in this case a static deformation can be applied to the wafer 25 using a deformable wafer chuck 20 which will place the entire illuminated part of the wafer 25 in the (curved) surface of best focus.

If the wafer is deformed to compensate for field curvature, some distortion of the patterned area will occur, as in the case of the reticle. However, by properly adjusting the deformation of both reticle and wafer in the Y plane, it should be possible to cancel out some of the effects. Because of the narrowness of the illumination slit, field curvature correction is only likely to be done normal to the scan direction, so the cancellation will only be done in the Y direction, i.e. orthogonal to the scanning direction. Defining the height variation of the wafer surface required to correct field curvature, and produced by a deformable wafer chuck, as Zwafer($y_w$), the related distortion is $t_w \partial$Zwafer($y_w$)/$\partial y$, where $t_w$ is the distance from the wafer surface to the effective midplane of the wafer plus wafer chuck, and the location is measured in the coordinate system of the wafer chip ($x_w, y_w$). Defining the reticle coordinates corresponding to ($x_w, y_w$) as ($x_r, y_r$) and the distance from the reticle surface to the effective midplane of the reticle plus reticle chuck as $t_r$, an appropriate error function can be defined:

$$Drw \equiv \sum_i \sum_j \left\{ \left[ (Zret(x_{ri}, y_{rj}) + Zchuck(x_{ri}, y_{rj}) + Zplane(x_{ri}, y_{rj})) \frac{\tan\theta}{M} + \frac{t_r}{M} \frac{\partial Zchuck(x_{ri}, y_{rj})}{\partial x} \right]^2 + \left[ t_w \frac{\partial Zwafer(y_{wj})}{\partial y} - \frac{t_r}{M} \frac{\partial Zchuck(x_{ri}, y_{rj})}{\partial y} \right]^2 \right\}. \quad (6)$$

As before, by adjusting Zplane and Zchuck to minimize Drw, the distortion for both components of the distortion at the wafer can be minimized in the least squares sense while still correcting for field curvature.

The operations described here to minimize distortion do not represent all possibilities. Other methods of optimization are possible and are included in this invention. For example, other error functions are possible, and methods of optimization other than least squares exist. Adjustment of the deformable mirror may be included in the error function, and simultaneous adjustment of the deformable mirror and both chucks may be used to reduce geometrical aberrations other than distortion.

Figure 1A:
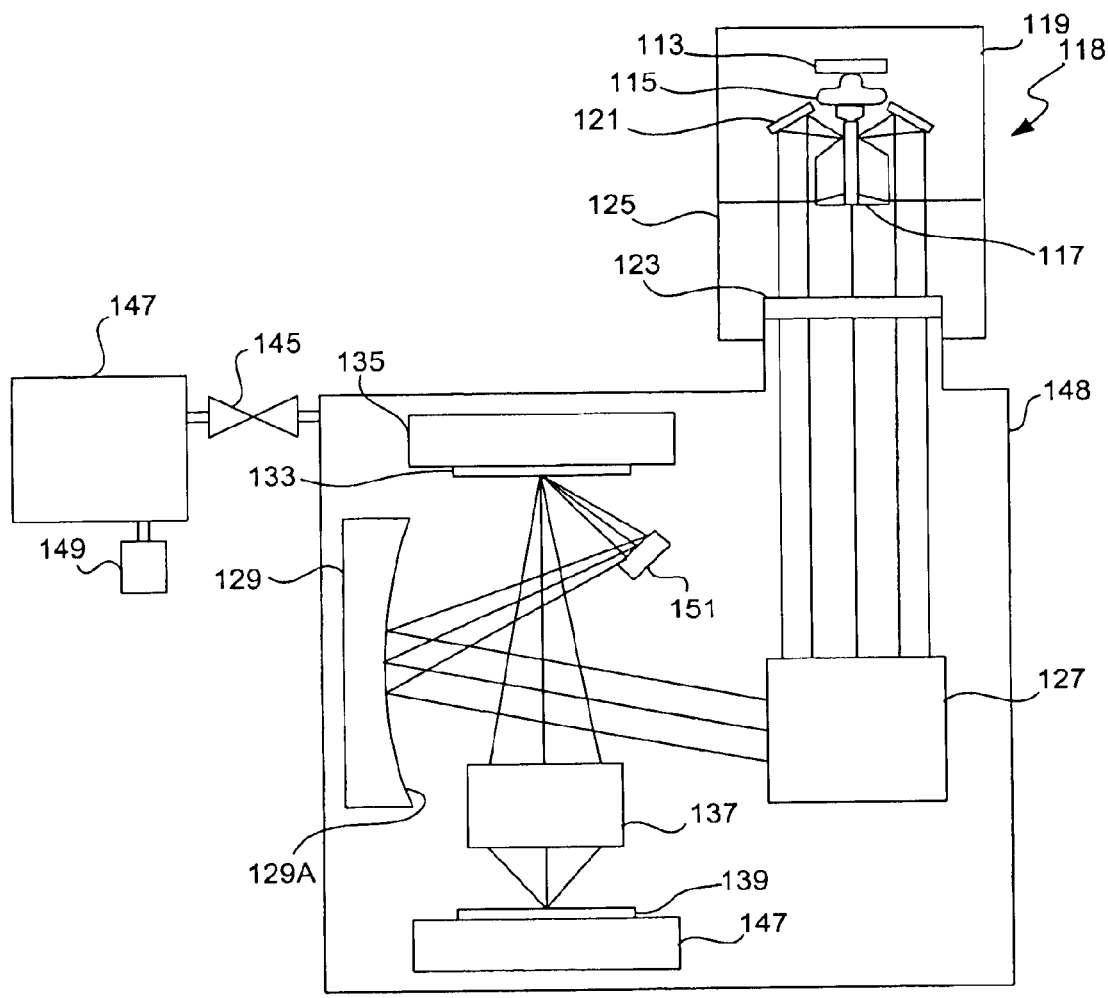
FIG. 1A is a schematic optical diagram of a representative embodiment of an X-ray microlithography system comprising an aberration and distortion correcting system according to any of the embodiments of this invention.
Figure 1B:
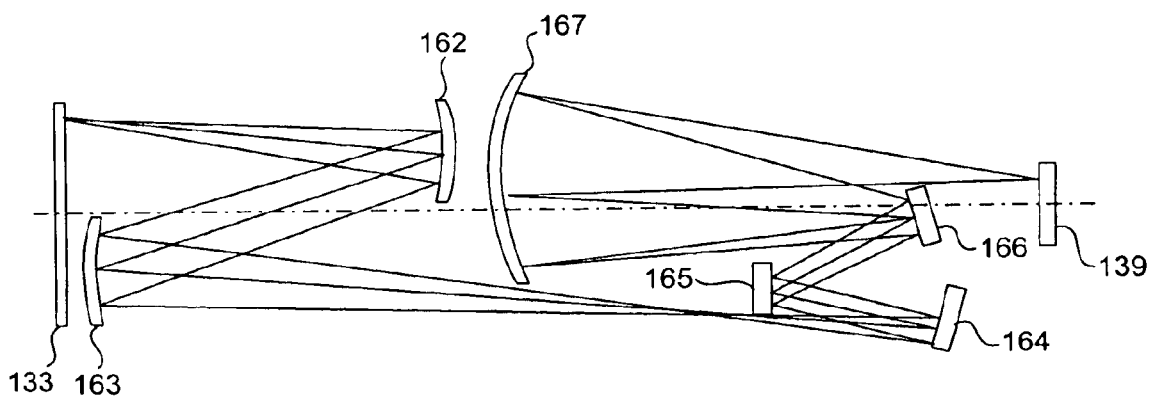
FIG. 1B is a detailed view of the projection-optical system of the microlithography system shown in FIG. 1A.

FIG. 1A shows an EUV (or soft-X-ray SXR) system 110, including the aberration and distortion correcting system of this invention as described above. As a lithographic energy beam, the EUV system 110 uses a beam of EUV light of wavelength λ=13 nm. The depicted system is configured to perform microlithographic exposures in a step-and-scan manner.

The EUV beam is produced by a laser-plasma source 117 excited by a laser 113 situated at the most upstream end of the depicted system 110. The laser 113 generates laser light at a wavelength within the range of near-infrared to visible. For example, the laser 113 can be a YAG laser or an excimer laser. Laser light emitted from the laser 113 is condensed by a condensing optical system 115 and directed to the downstream laser-plasma source 117. Upon receiving the laser light, the laser-plasma source 117 generates SXR (EUV) radiation having a wavelength (λ) of approximately 13 nm with good efficiency.

A nozzle (not shown), disposed near the laser-plasma source 117, discharges xenon gas in a manner such that the discharged xenon gas is irradiated with the laser light in the laser-plasma source 117. The laser light heats the discharged xenon gas to a temperature sufficiently high to produce a plasma that emits photons of EUV light as the irradiated xenon atoms transition to a lower-potential state. Since EUV light has low transmittance in air, the optical path for EUV light propagating from the laser-plasma source 117 is contained in a vacuum chamber 119 normally evacuated to high vacuum. Since debris normally is produced in the vicinity of the nozzle discharging xenon gas, the vacuum chamber 119 desirably is separate from other chambers of the system.

A parabolic mirror 121, coated with a Mo/Si multilayer film, is disposed relative to the laser-plasma source 117 so as to receive EUV light radiating from the laser-plasma source 117 and to reflect the EUV light in a downstream direction as a collimated beam. The multilayer film on the parabolic mirror 121 is configured to have high reflectivity for EUV light of which λ=approximately 13 μm.

The collimated beam passes through a visible-light-blocking filter 123 situated downstream of the parabolic mirror 121. By way of example, the filter 123 is made of Be, with a thickness of 0.15 μm. Of the EUV radiation reflected by the parabolic mirror 121, only the desired 13-nm wavelength of radiation passes through the filter 123. The filter 123 is contained in a vacuum chamber 125 evacuated to high vacuum.

An exposure chamber 143 is disposed downstream of the filter 123. The exposure chamber 148 contains an illumination-optical system 127 that comprises a condenser mirror and a fly-eye mirror (not shown, but well understood in the art). The illumination-optical system 127 also is configured to trim the EUV beam (propagating from the filter 123 ) to have an arc-shaped transverse profile. The shaped "illumination beam" is irradiated toward the left in the figure.

A circular, concave mirror 129 is situated so as to receive the illumination beam from the illumination-optical system 127. The concave mirror 129 has a parabolic reflective surface 129a and is mounted perpendicularly in the vacuum chamber 148. The concave mirror 129 comprises, for example, a quartz mirror substrate of which the reflection surface is machined extremely accurately to the desired parabolic configuration. The reflection surface of the mirror substrate is coated with a Mo/Si multilayer film as to form the reflective surface 129a that is highly reflective to EUV radiation of which λ=13 nm. Alternatively, for other wavelengths in the range of 10–15 nm, the multilayer film can be of a first substance such as Ru (ruthenium) or Rh (rhodium) and a second substance such as Si, Be (Beryllium) or $B_4C$ (carbon tetraboride).

A mirror 131 is situated at an angle relative to the concave mirror 129 so as to received the EUV beam from the concave mirror 129 and direct the beam at a low angle of incidence to a reflective reticle 133. The reticle 133 is disposed horizontally so that its reflective surface faces downward in the figure. Thus, the beam of EUV radiation emitted from the illumination-optical system 127 is reflected and condensed by the concave mirror 129, directed by the mirror 151, and focused don the reflective surface of the reticle 133.

The reticle 133 includes a multilayer film so as to be highly reflective to incident EUV light. A reticle pattern, corresponding to the pattern to be transferred to a substrate 139, is defined in an EUV-absorbing layer formed on the multiplayer film of the reticle 133, as discussed later below. The reticle 133 is mounted via a reticle chuck on a reticle stage 135 that moves the reticle 133 at least in the Y direction. The reticle 133 normally is too large to be illuminated entirely during a single exposure "shot" of the EUV beam. As a result of the mobility of the reticle stage 135, successive regions of the reticle 133 can be irradiated sequentially so as to illuminate the pattern in a progressive manner with EUV light from the mirror 131.

A projection-optical system 137 and substrate (such as a semiconductor wafer) 139 are disposed in that order downstream of the reticle 133. The projection-optical system 137 comprises multiple multilayer-film reflective mirrors that collectively demagnify an aerial image of the illuminated portion of the pattern on the reticle 133. The demagnification normally is according to a predetermined demagnification factor such as ¼. The projection-optical system 137 focuses an aerial image of the illuminated pattern portion onto the surface of the substrate 139. Meanwhile, the substrate 139 is mounted via a wafer (substrate) chuck on a substrate stage 141 that is movable in the X, Y, and Z directions.

Connected to the exposure chamber 143 via a gate valve 145 is a preliminary-evacuation ("load-lock") chamber 147. The load-lock chamber 147 allows exchanges of the reticle 133 and/or substrate 139 as required. The load-lock chamber 147 is connected to a vacuum pump 149 that evacuates the load-lock chamber 147 to a vacuum level substantially equal to the vacuum level inside the exposure chamber 143.

During a microlithographic exposure, EUV light from the illumination-optical system 127 irradiates the reflective surface of the reticle 133. Meanwhile, the reticle 133 and substrate 139 are moved by their respective stages 135 and 141 in a synchronous manner relative to the projection-optical system 137. The stages 135 and 141 move the reticle 133 and the substrate 139, respectively, at a velocity ratio determined by the demagnification factor of the projection-optical system 137. Thus, the entire circuit pattern defined don the reticle 133 is transferred, in a step-and-scan manner, to one or more "die" or "chip" locations on the substrate 139. By way of example, each "die" or "chip" on the substrate 139 is a square having 25-mm sides. The pattern is thus "transferred" from the reticle 133 to the substrate at very high resolution (such as sufficient to resolve a 0.07-$\mu$m line-and-space (L/S) pattern). So as to be imprintable with the projected pattern, the upstream-facing surface of the substrate 139 is coated with a suitable "resist."

In the system 110 of FIG. 1A at least one multilayer-film optical element as described above is included in at least one of the illumination-optical system 127, the reticle 133, and the projection-optical system 137.

Figure 1C:
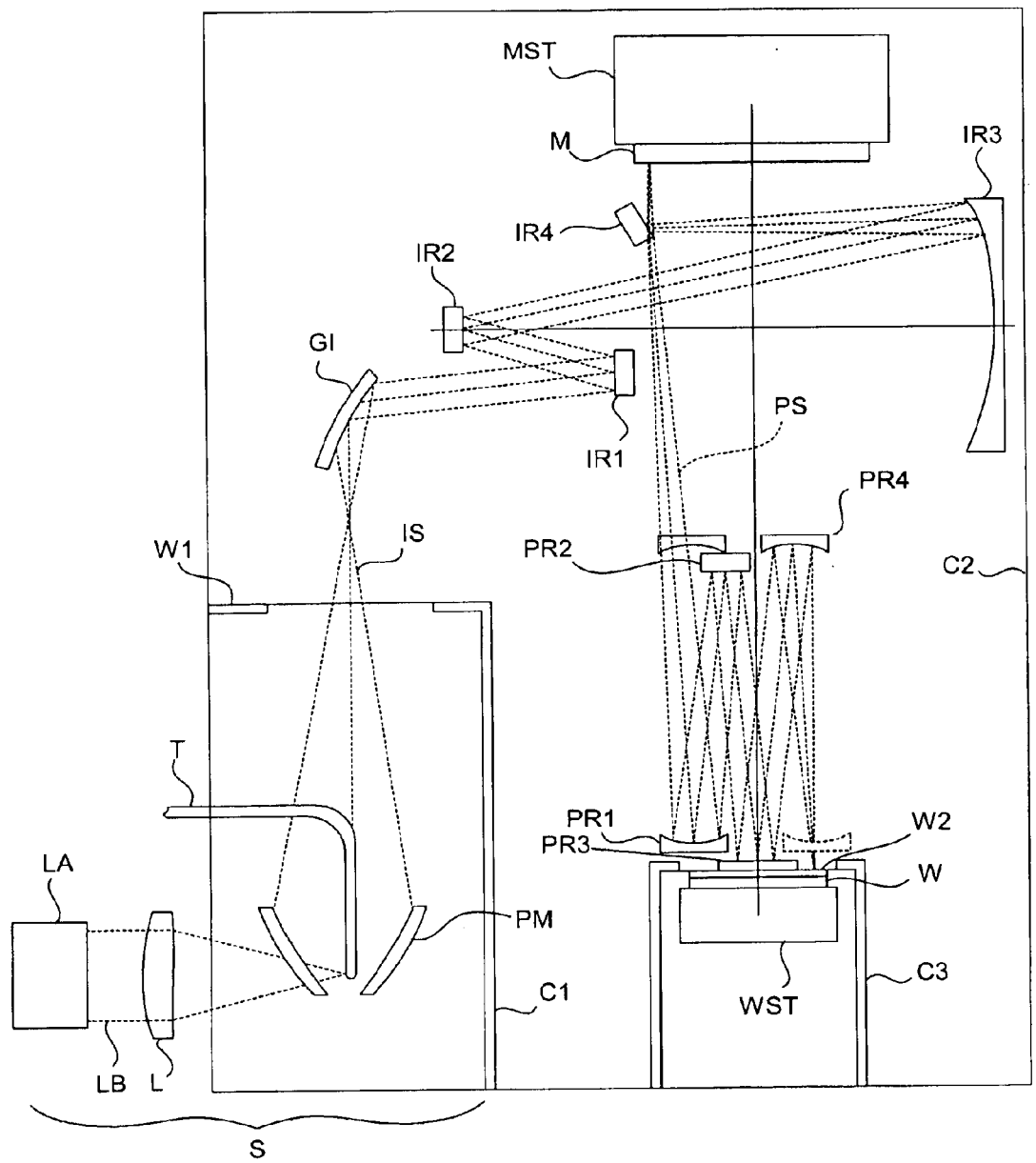
FIG. 1C is a schematic optical diagram of another representative embodiment of an X-ray microlithography system comprising an aberration and distortion correcting system according to any of the embodiments of this invention.

FIG. 1C shows another embodiment of an X-ray (specifically EUV) microlithography system utilizing one or more multilayer-film reflective optical elements as described herein and comprising a EUV source S, an illumination-optical system (comprising elements GI and IR1–IR4), a reticle stage MST for holding a reticle M, a projection-optical system (comprising elements PR1–PR4) and a substrate stage WST for holding a substrate W (such as a semiconductor wafer).

The EUV source S generates an illumination beam IB of EUV light. To such end, a laser LA generates and directs a high-intensity laser beam LB (near-IR to visible) through a lens L to the discharge region of a nozzle T that discharges a target substance such as xenon. The irradiated target substance forms a plasma that emit photons of EUV light that constitute the illumination beam IB. The illumination beam IB is reflected by a parabolic multilayer-film mirror PM to a window W1. The EUV source S is contained in a chamber C1 that is evacuated to a suitably high vacuum by means of a vacuum pump (not shown). The illumination beam IB passes through the window W1 to the interior of an optical-system chamber C2.

The illumination beam IB then propagates to the illumination-optical system comprising mirrors GI, IR1, IR2, IR3 and IR4. The mirror GI is a grazing-incidence mirror that reflects the grazing-incident illumination beam IB from the EUV source S. (Alternatively, the mirror GI can be a multilayer-film mirror.) The mirrors IR1, IR2, IR3 and IR4 are multilayer-film mirrors each including a surface multilayer film exhibiting high reflectivity to incident EUV radiation, as described elsewhere herein. The illumination-optical system also comprises a filter (not shown) that is transmissive only to EUV radiation of a prescribed wavelength. The illumination-optical system directs the illumination beam IB, having the desired wavelength, to a selected region on the reticle M. The reticle M is a reflective reticle including a multilayer film. The beam reflected from the reticle M carries an aerial image of the illuminated region of the reticle M; hence the reflected beam is termed a patterned beam.

The protection-optical system comprises multiple multilayer-film mirrors PR1, PR2, PR3 and PR4 that collectively project an image of the illuminated portion of the reticle M onto a corresponding location on the substrate W. Thus, the pattern defined by the reticle M is transfer-exposed onto the substrate W. Note that several of the mirrors PR1-PR4 (specially the mirrors PR1 and PR4) have a cutout allowing the patterned beam unobstructed passage in the projection-optical system. So as to be imprintable with the projected pattern, the substrate W is coated with an exposure-sensitive resist. Since EUV radiation is absorbed and attenuated in the atmosphere, the environment in the optical-system chamber C2 is maintained at a suitably high vacuum (such as $10^{-5}$ Torr or less). Actual exposure of the substrate W can be performed in a "step-and-repeat," "step-and-scan," or pure s canning-exposure manner, or other suitable manner, all of which involving controlled movements of the reticle stage MST and substrate stage WST relative to each other as transfer-exposure of the pattern progresses. During exposure, the substrate W is situated in a separate chamber C3, termed a "substrate chamber" or "wafer chamber," that contains the substrate stage WST. As the patterned beam PB enters the substrate chamber C3 from the optical-system chamber C2, the beam passes through a window W2.

Wavefront aberration must be controlled so as to satisfy a given specification but a wavefront aberration correction system of this invention can be used to a correct such wavefront aberration errors. Wavefront aberration can be measured either in situ or outside the system. A device for measuring wavefront aberration of a EUV projection-optical system is described, for example, in the U.S. Pat. No. 6,266,389 issued Jul. 24, 2001, which is herein incorporated by reference. The surface shape of a mirror is varied such that the measured wavefront aberration comes to satisfy the given specification but it is not necessary to vary the surface configurations of all of the mirrors. It is sufficient if the surface configuration of at least one of the mirrors is made adjustable. A method of obtaining the final surface configuration of the mirror from the measured wavefront aberration is also described in aforementioned U.S. Pat. No. 6,266,389.

Figure 2:
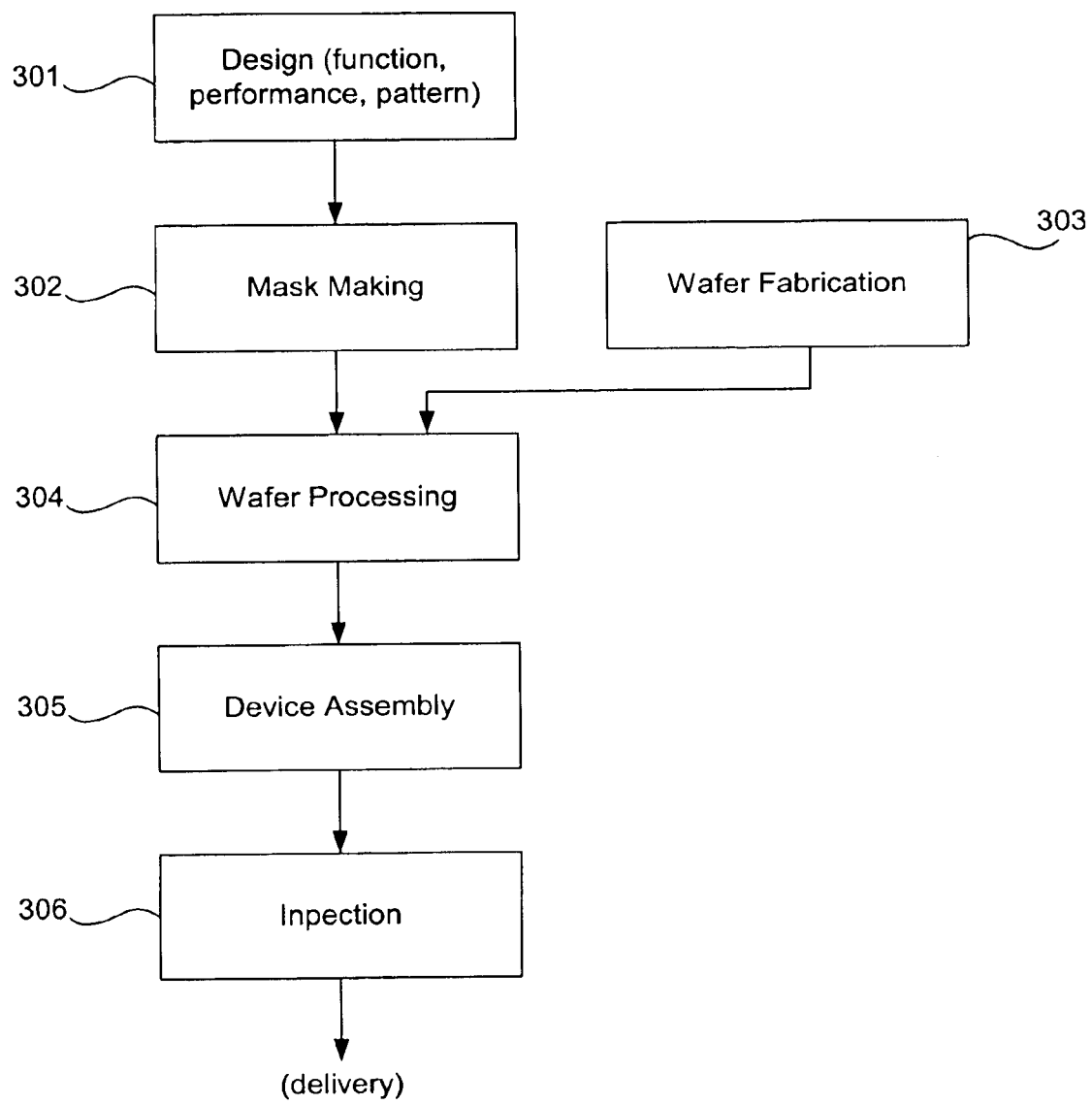
FIG. 2 is a process flow diagram illustrating an exemplary process by which semiconductor devices are fabricated by using the apparatus shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
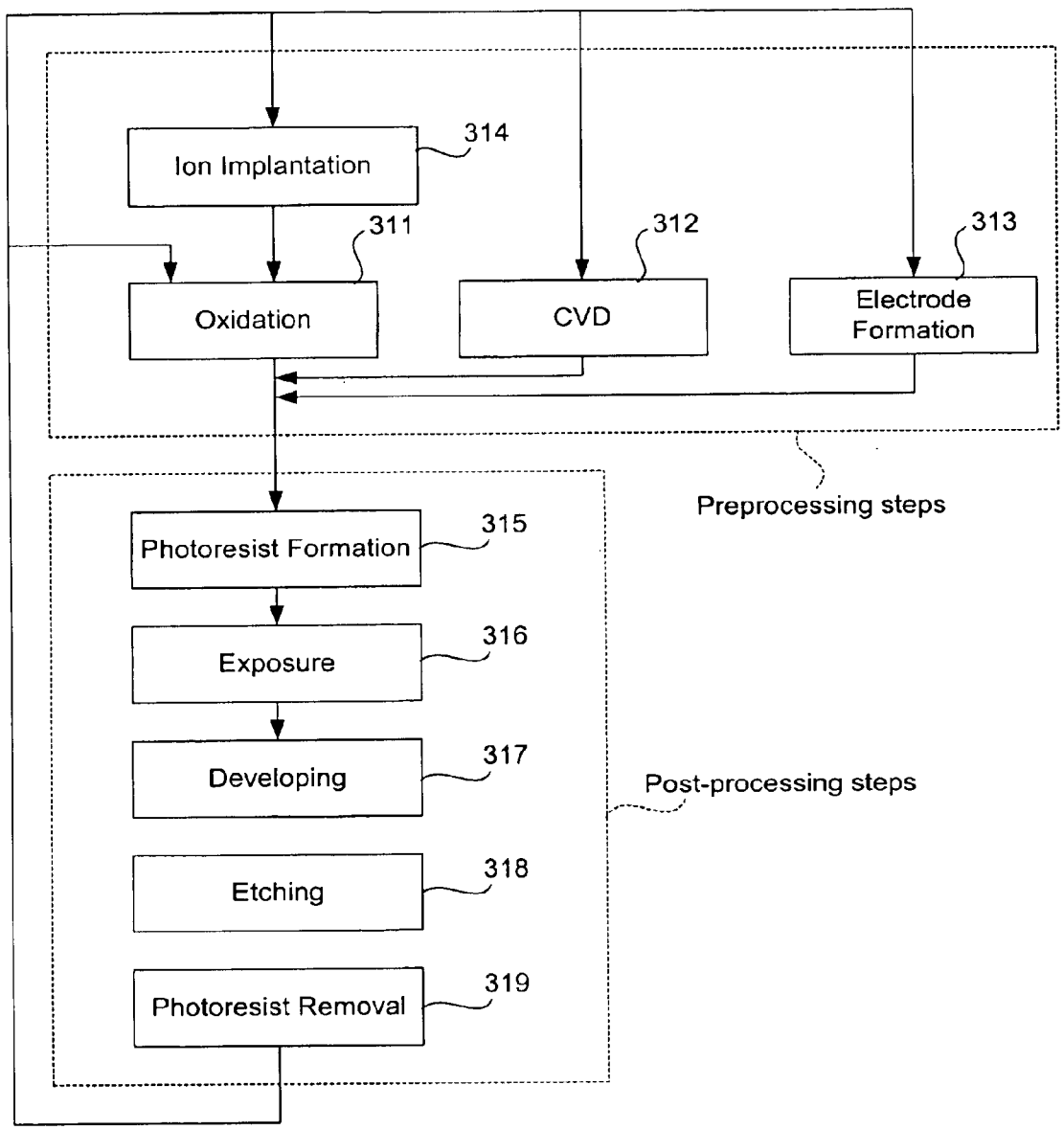
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

What is claimed is:

1. A system for correcting aberration and distortion in EUV lithography, said system comprising:
   a deformable reticle chuck that has a reticle placed thereon;
   a reticle height sensor that measures a height of the reticle placed on said deformable reticle chuck;
   an optical system that has an exit pupil, projects EUV radiation onto the reticle placed on said reticle chuck and leads reflected EUV radiation from said reticle through said exit pupil onto a wafer placed on a wafer chuck; said optical system including a deformable mirror proximal to said exit pupil;
   wherein said deformable reticle chuck and said deformable mirror are controlled such that aberration and distortion of an image of said reticle formed on said wafer by said optical system are corrected based on the height measured by said reticle height sensor.

2. The system of claim 1 further comprising a wafer height sensor that detects a height of said wafer, wherein aberration and distortion of the image are corrected based also on the height measured by said wafer height sensor.

3. The system of claim 1 wherein said wafer chuck is deformable and deformation and distortion of the image are corrected also by deforming said wafer chuck.

4. The system of claim 1 wherein said reticle has an electrically conductive coating thereon and said deformable reticle chuck comprises:
   a supporting structure having a top surface;
   a deformable membrane disposed above said supporting structure, said deformable membrane comprising a dielectric layer of a dielectric material and a conductive layer of an electrically conductive material;
   a voltage source connected to said conductive coating of said reticle and said conductive layer to generate an electrostatic attractive force therebetween;
   a plurality of actuator rods each connected to a corresponding one of actuators, said actuator rods penetrating said supporting structure and protruding above said top surface, said actuator rods supporting and contacting said membrane, leaving a chamber between said membrane and said top surface of said supporting structure; and
   a coolant gas inside said chamber.

5. The system of claim 4 wherein said supporting structure has throughholes through which a coolant fluid is passed.

6. The system of claim 4 further comprising a clamping plate for clamping said actuator rods in place after said actuator rods are adjusted.

7. A method of correcting aberration and distortion in EUV lithography, said method comprising the steps of:
   placing a reticle on a deformable reticle chuck;
   measuring heights of said reticle by a reticle height sensor;
   projecting EUV radiation onto said reticle and leading reflected EUV radiation from said reticle through an exit pupil of an optical system onto a wafer placed on a wafer chuck, said optical system including a deformable mirror proximal to said exit pupil;
   controlling said deformable reticle chuck and thereby correcting aberration and distortion of an image of said reticle formed on said wafer by said optical system based on the height measured by said reticle height sensor.

8. The method of claim 7 wherein said deformable reticle chuck comprises:
   a supporting structure having a top surface;
   a deformable membrane disposed above said supporting structure, said deformable membrane comprising a dielectric layer of a dielectric material and a conductive layer of an electrically conductive material;
   a voltage source connected to said conductive coating of said reticle and said conductive layer to generate an electrostatic attractive force therebetween;
   a plurality of actuator rods each connected to a corresponding one of actuators, said actuator rods penetrating said supporting structure and protruding above said top surface, said actuator rods supporting and contacting said membrane, leaving a chamber between said membrane and said top surface of said supporting structure; and
   a coolant gas inside said chamber.

9. The method of claim 8 further comprising the step of passing a coolant fluid through a throughhole formed through said supporting structure.

10. The method of claim 8 further comprising the step of clamping said actuator rods in place after adjusting said actuator rods.

11. The method of claim 7 further comprising the step of adjusting said deformable mirror proximal to said exit pupil and thereby correcting aberration and distortion of said image of said reticle formed on said wafer by said optical system.

12. The method of claim 7 further comprising the step of measuring a height of said wafer by means of a wafer height sensor and thereby correcting aberration and distortion of said image of said reticle formed on said wafer by said optical system.

13. A lithography system comprising:

an illumination source;

a deformable reticle chuck that has a reticle placed thereon;

a reticle height sensor that measures a height of the reticle placed on said deformable reticle chuck;

a wafer chuck having a wafer placed thereon;

an optical system that has an exit pupil, projects EUV radiation from said illumination source onto the reticle placed on said reticle chuck and leads reflected EUV radiation from said reticle through said exit pupil onto said wafer placed on said wafer chuck, said optical system including a deformable mirror proximal to said exit pupil; and an enclosure that surrounds at least a portion of said wafer chuck, the enclosure having a sealing surface;

wherein said deformable reticle chuck and said deformable mirror are controlled such that aberration and distortion of an image of said reticle formed on said wafer by said optical system are corrected based on the height measured by said reticle height sensor.

14. An object manufactured with the lithography system of claim 13.

15. A wafer on which an image has been formed by the lithography system of claim 13.

16. A method for making an object using a lithography process, wherein the lithography process utilizes a lithography system as recited in claim 13.

17. A method for patterning a wafer using a lithography process, wherein the lithography process utilizes a lithography system as recited in claim 13.

* * * * *